(12) United States Patent
Zhou

(10) Patent No.: US 10,361,196 B2
(45) Date of Patent: Jul. 23, 2019

(54) METHOD AND DEVICE FOR FINFET WITH GRAPHENE NANORIBBON

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Ming Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 22 days.

(21) Appl. No.: 15/477,815

(22) Filed: Apr. 3, 2017

(65) Prior Publication Data
US 2018/0006031 A1    Jan. 4, 2018

(30) Foreign Application Priority Data
Jul. 1, 2016    (CN) .......................... 2016 1 0512145

(51) Int. Cl.
H01L 27/088    (2006.01)
H01L 29/78    (2006.01)
(Continued)

(52) U.S. Cl.
CPC .... H01L 27/0886 (2013.01); H01L 21/28556 (2013.01); H01L 21/76224 (2013.01);
(Continued)

(58) Field of Classification Search
CPC .......................... H01L 27/0886; H01L 29/785
See application file for complete search history.

(56) References Cited

U.S. PATENT DOCUMENTS

2012/0168723 A1    7/2012 Park
2013/0146846 A1    6/2013 Adkisson et al.
(Continued)

FOREIGN PATENT DOCUMENTS

EP    3264472 A1    1/2018

OTHER PUBLICATIONS

European Application No. 17178739.3, Extended European Search Report dated Nov. 7, 2017, 7 pages.

Primary Examiner — Lex H Malsawma
Assistant Examiner — Xia L Cross
(74) Attorney, Agent, or Firm — Kilpatrick Townsend & Stockton LLP

(57) ABSTRACT

A method for forming a semiconductor device includes providing a substrate structure, which has a semiconductor substrate and a semiconductor fin on the substrate. The method also includes forming a catalytic material layer overlying the semiconductor fins, and forming an isolation region covering the catalytic material layer in a lower portion of the semiconductor fins. Next, a graphene nanoribbon is formed on the catalytic material layer on an upper portion of the semiconductor fin, and a gate structure is formed on the graphene nanoribbon.

15 Claims, 4 Drawing Sheets

(51) Int. Cl.
*H01L 21/285* (2006.01)
*H01L 21/762* (2006.01)
*H01L 29/16* (2006.01)
*H01L 29/40* (2006.01)
*H01L 29/66* (2006.01)

(52) U.S. Cl.
CPC ........ *H01L 29/1606* (2013.01); *H01L 29/401* (2013.01); *H01L 29/66795* (2013.01); *H01L 29/785* (2013.01); *H01L 29/7851* (2013.01)

(56) References Cited

U.S. PATENT DOCUMENTS

2014/0015015 A1* 1/2014 Krivokapic ....... H01L 21/02527
 257/288
2014/0367795 A1* 12/2014 Cai .................... H01L 27/0886
 257/392

* cited by examiner

METHOD AND DEVICE FOR FINFET WITH GRAPHENE NANORIBBON

CROSS-REFERENCES TO RELATED APPLICATIONS

This application claims priority to Chinese patent application No. 201610512145.9, filed on Jul. 1, 2016, the content of which is incorporated herein by reference in its entirety.

BACKGROUND OF THE INVENTION

The present invention relates to a semiconductor device, and more particularly, to a semiconductor device and a method for manufacturing.

FinFETs (Fin Field Effect Transistors) provide good gate control capability and are widely used in the semiconductor element in the design of small size. However, as the critical dimensions of semiconductor devices shrink, the performance of the FinFET silicon-based devices are also subject to certain restrictions. Therefore, it is desirable to have a new semiconductor device that can further improve the performance of FinFET devices.

BRIEF SUMMARY OF THE INVENTION

Embodiments of the present invention provide a device structure and a method of manufacturing a semiconductor device capable of improving the performance of FinFETs.

According to some embodiments of the present invention, a method for forming a semiconductor device includes providing a substrate structure, which has a semiconductor substrate and a semiconductor fin on the substrate. The method also includes forming a catalytic material layer overlying the semiconductor fins, and forming an isolation region covering the catalytic material layer in a lower portion of the semiconductor fins. Next, a graphene nanoribbon is formed on the catalytic material layer on an upper portion of the semiconductor fin, and a gate structure is formed on the graphene nanoribbon.

In an embodiment of the above method, the semiconductor substrate and the semiconductor fin are configured as a back gate of the semiconductor device.

In some embodiments, the substrate structure includes a plurality of semiconductor fins. In these embodiments, each semiconductor fin is configured as a back gate.

In another embodiment, forming an isolation region includes the following steps:
  depositing an isolation material to cover the semiconductor fins;
  planarizing the insulating material to expose a layer of the catalytic material on a top surface of the semiconductor fin; and
  etching an upper portion of the insulating material to expose the catalytic material layer in the upper portion of the semiconductor fin.

In another embodiment, the catalytic material comprises a layer of aluminum oxide, hafnium oxide, or zirconium oxide.

In another embodiment, the graphene nanoribbon is formed using a chemical vapor deposition by (CVD) process under the following conditions:
  the reaction gases include methane, hydrogen and carrier gas;
  the reaction temperature is between about 600° C. to about 1500° C.; and
  the reaction time is 5-300 min.

The carrier gas flow rate is at 0-10000 sccm, a ratio of the flow rate of methane and the flow rate of the carrier gas is 0.05%-50%, and a ratio of the flow rate of hydrogen and the flow rate of the carrier gas is 0.05%-50%.

In another embodiment, providing a substrate structure includes the following steps:
  providing an initial substrate;
  forming a patterned hard mask on the initial substrate; and
  etching the initial substrate with the patterned hard mask as an etch mask to form the substrate, and a semiconductor fin on the substrate.

In another embodiment, forming a gate structure on the graphene nanoribbon includes forming a gate dielectric layer on the graphene nanoribbon, and forming a gate on the gate dielectric layer.

In another embodiment, the gate dielectric layer comprises one or more of boron nitride, aluminum nitride, silicon oxide or amorphous silicon carbide, and the gate comprises a metal or polysilicon.

In another embodiment, the semiconductor substrate can be a silicon substrate, and the semiconductor fin is formed in silicon.

According to some embodiments of the invention, a semiconductor device includes a substrate, a semiconductor fin on the substrate, and a catalytic material layer covering the semiconductor fin. The device also has an isolation region on a side surface of the semiconductor fin, with the isolation region covering the catalytic material layer in a lower portion of the semiconductor fin. Further, the device has a graphene nanoribbon disposed on the catalytic material layer in the upper portion of the semiconductor fin; and a gate structure on the graphene nanoribbon.

In an embodiment of the above device, the substrate and the semiconductor fin are configured as a back gate.

In another embodiment, the semiconductor device includes a plurality of semiconductor fins. An isolation region is disposed between adjacent semiconductor fins, and each of the semiconductor fins is configured as a back gate.

In another embodiment, the catalytic material includes a layer of aluminum oxide, hafnium oxide, or zirconium oxide.

In another embodiment, the gate structure includes a gate dielectric layer on the graphene nanoribbon and a gate on the gate dielectric layer.

In another embodiment, the gate dielectric layer includes one or more of boron nitride, aluminum nitride, silicon oxide, or amorphous silicon carbide, and the gate comprises a metal or polysilicon.

In another embodiment, the substrate includes a silicon substrate, and the semiconductor fin is formed with silicon.

A further understanding of the nature and advantages of the present invention may be realized by reference to the remaining portions of the specification and the drawings.

DETAILED DESCRIPTION OF THE INVENTION

Figure 1:
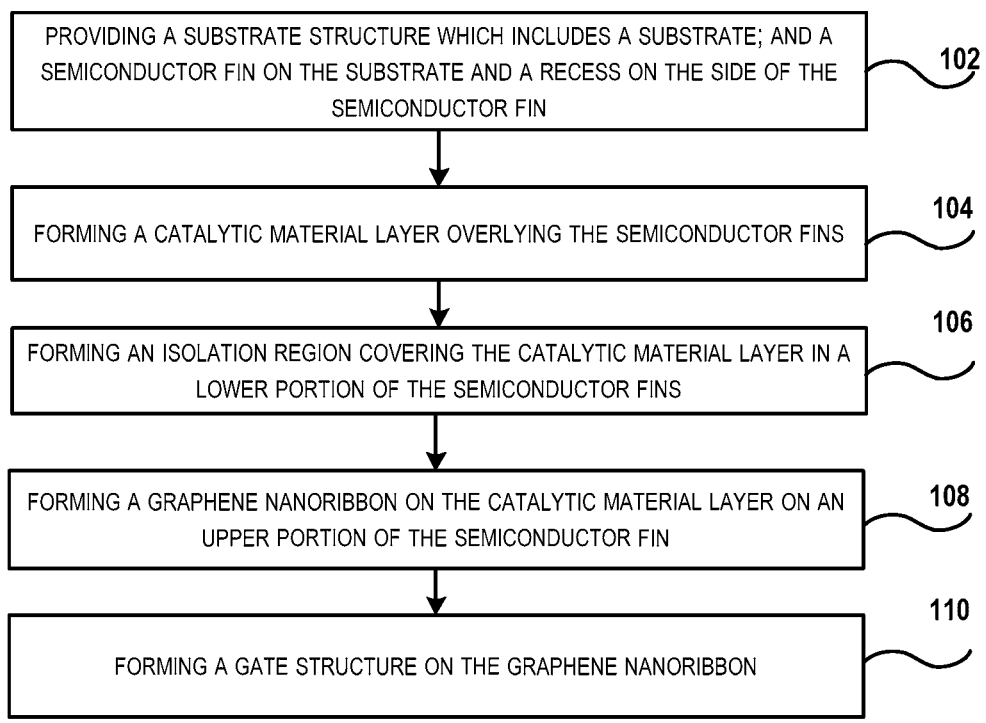
FIG. 1 is a simplified flow chart illustrating a method of manufacturing a semiconductor device according to an embodiment of the present invention.

The various exemplary embodiments of the present disclosure will now be described in detail with reference to the accompanying drawings. It should be understood that the relative arrangements, numerical expressions, and numerical values of the components and steps set forth in these embodiments should not be construed as limiting the scope of the invention unless otherwise specifically stated.

In addition, it should be understood that the dimensions of the various components shown in the figures are not necessarily drawn in an actual scale relationship for ease of description, such as the thickness or width of certain layers may be exaggerated relative to other layers.

The following description of exemplary embodiments is illustrative only and is not to be taken as a limitation on the invention, its application or use in any sense. Techniques, methods, and apparatus known to those of ordinary skill in the relevant art may not be discussed in detail, but such techniques, methods, and apparatuses should be considered as part of this description insofar as they apply to such techniques, methods, and apparatuses. It should be noted that like reference numerals and letters designate like items in the following drawings, and therefore, once an item is defined or illustrated in one of the drawings, it will not be necessary to go further in the description of the subsequent figures discuss.

Graphene-based transistors are considered to be an alternative to silicon transistors. Based on analysis, graphene-based transistors are believed to be able to provide good performance, such as on/off current ratio and suitability for low-voltage operation. However, the structure and the manufacturing process of graphene-based transistors suitable for practical application and mass production are still unknown. Embodiments of the present invention provide a graphene-based semiconductor device and a method of manufacturing.

FIG. 1 is a simplified flow chart illustrating a method of manufacturing a semiconductor device according to an embodiment of the present invention. The method is briefly summarized below and described further with reference to FIGS. 2A-2E.

Step 102—providing a substrate structure which includes a substrate; and a semiconductor fin on the substrate and a recess on the side of the semiconductor fin;

Step 104—forming a catalytic material layer overlying the semiconductor fins;

Step 106—forming an isolation region covering the catalytic material layer in a lower portion of the semiconductor fins;

Step 108—forming a graphene nanoribbon on the catalytic material layer on an upper portion of the semiconductor fin; and Step 110—forming a gate structure on the graphene nanoribbon.

This embodiment provides a method of manufacturing a semiconductor device based on graphene nanoribbons. The catalytic material formed on the semiconductor fin can enable the formation of graphene nanoribbons, which can be formed as a channel of the nanoribbon graphene FinFET devices. The carrier mobility can be greatly increased to improve the performance of the device.

FIGS. 2A-2E are cross-sectional diagrams illustrating the method for manufacturing a semiconductor device as shown in the flowchart of FIG. 1 according to embodiments of the present invention.

Figure 2A:
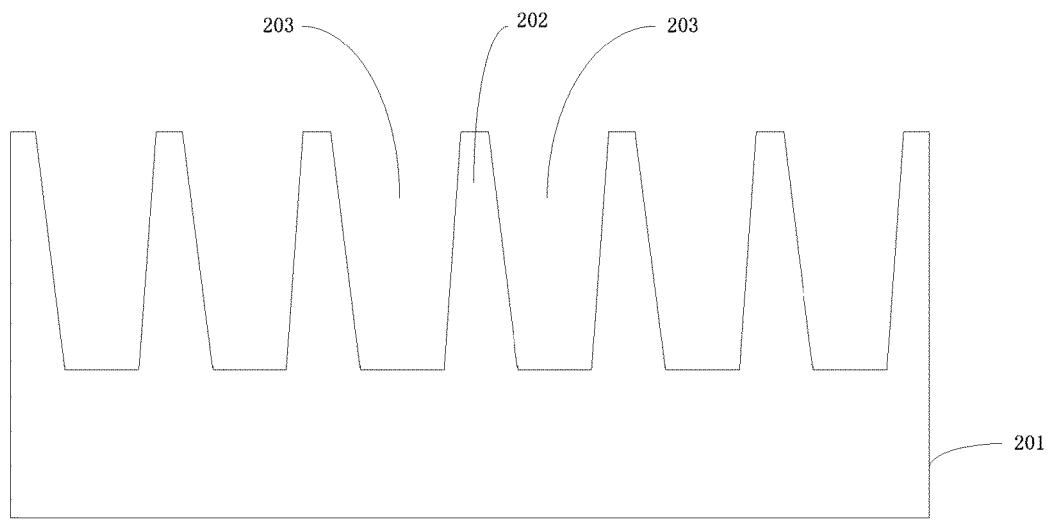
FIG. 2A is a cross-sectional diagram illustrating a stage of manufacturing a semiconductor device according to an embodiment of the present invention.

First, as shown in FIG. 2A, a substrate structure is provided. The substrate structure includes a substrate 201, which can be a semiconductor substrate, and a semiconductor fin 202 on the substrate. Recesses 203 are formed on the sides of semiconductor fin 202. Here, for example, the substrate 201 may be a silicon substrate of P-type or N-type, III-V semiconductor substrate, and so on. In one embodiment, there can be multiple semiconductor fins 202. In one embodiment, the material of semiconductor fin 202 and substrate 201 can be of the same material, such as silicon. Recess regions 203 can be formed as recesses in the substrate as a result of etching the substrate to form the semiconductor fins. Alternatively, the semiconductor fins can be formed by a second semiconductor material, and recesses 203 are formed in substrate 201 by further etching.

The substrate structure illustrated in FIG. 2A may be implemented in different ways, In this embodiment, the step of providing a substrate structure may include: first, providing an initial substrate, such as a silicon substrate; then, patterning a hard mask, such as a nitride of silicon, on the initial substrate; after that, the initial substrate is etched using the patterned hard mask as a mask, such as dry etching or wet etching, to form a substrate, and the semiconductor fins on the substrate. Recess regions 203 can be formed as recesses in the substrate as a result of etching the substrate to form the semiconductor fins. Alternatively, the semiconductor fins can be formed by a second semiconductor material, and recesses 203 are formed in substrate 201 by further etching.

Figure 2B:
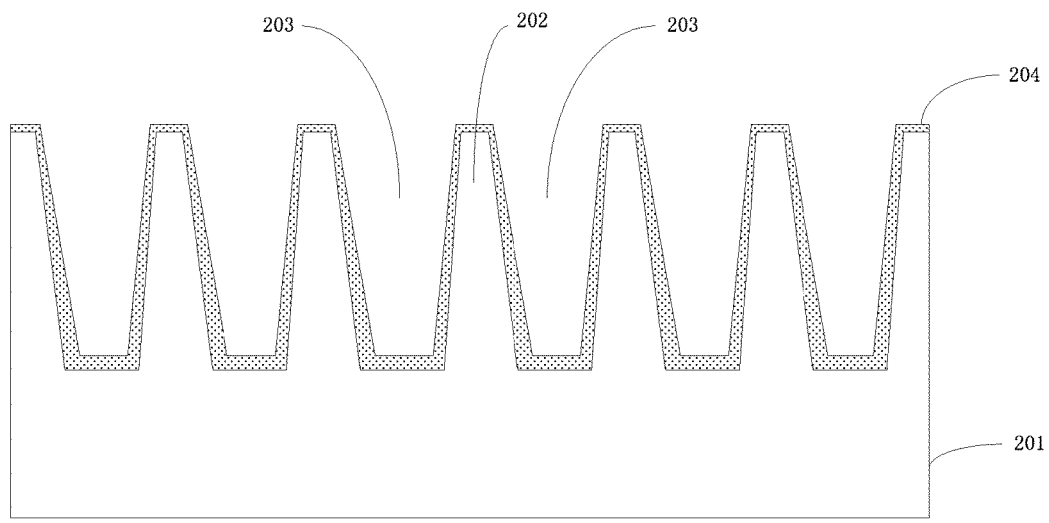
FIG. 2B is a cross-sectional diagram illustrating another stage of manufacturing a semiconductor device according to an embodiment of the present invention.

Then, as shown in FIG. 2B, a catalytic material 204 is formed on semiconductor fins 202 to cover the semiconductor fins. In one embodiment, the catalytic material may include a layer of aluminum oxide ($Al_2O_3$), hafnium oxide ($HfO_2$) or zirconium oxide ($ZrO_2$). For example, catalytic material 204 can be formed by atomic layer deposition (Atomic Layer Deposition, ALD). In an embodiment, $Al_2O_3$ of thickness of 20-60 nm, e.g., 50 nm, can be deposited as catalytic material layer 204. However, catalytic material layer 204 is not limited to the specific examples given above; the layer of catalytic material 204 may also be of other materials, as long as it can act as a catalytic material for the formation of graphene nanoribbons.

Figure 2C:
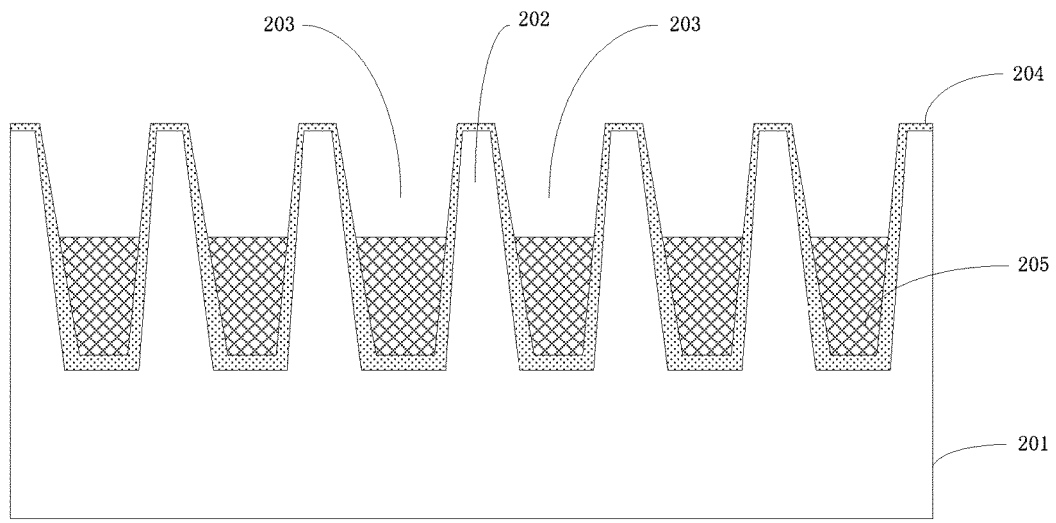
FIG. 2C is a cross-sectional diagram illustrating another stage of manufacturing a semiconductor device according to an embodiment of the present invention.

Next, as shown in FIG. 2C, isolation regions 205 are formed in the lower portion of the recess 203 to cover the catalytic material covering the lower portion of semiconductor fins 202. In one implementation, isolation region 205 can be formed according to the following: first, for example, a dielectric material such as silicon oxide can be formed by ALD or FCVD (Flowable Chemical Vapor Deposition) to fill recess 203 and cover semiconductor fins 202. Thereafter, the dielectric material is planarized to expose the layer of catalytic material 204 on the top surface of semiconductor fins 202. Thereafter, the upper portion of the dielectric material is etched back (e.g., using diluted hydrofluoric acid)

to expose a layer of the catalytic material 204 on the upper portion of semiconductor fins 202 of the fin. The remaining dielectric material 205 forms the isolation regions.

It should be noted that the terms "upper" and "lower" referred to in this disclosure are merely relative concepts; for example, the "upper" and "lower" portions of the recess may be delimited in the middle of the recess, or another point in the recess, in the longitudinal direction.

Figure 2D:
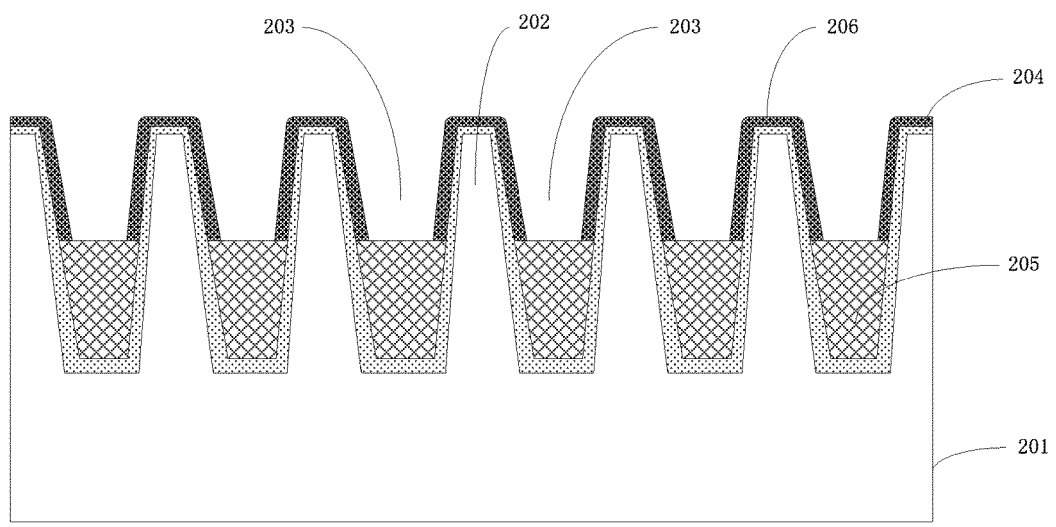
FIG. 2D is a cross-sectional diagram illustrating another stage of manufacturing a semiconductor device according to an embodiment of the present invention.

Then, as shown in FIG. 2D, graphene nanoribbons 206 are formed on the layer of catalytic material 204 on the upper portion of semiconductor fin 202. As known to the inventor, graphene nanoribbon is a semiconductor material with a bandgap. In one embodiment, the graphene nanoribbon may be formed by chemical vapor deposition nanoribbons (CVD), with the deposition of graphene nano-layer on the catalytic material. Therefore, the graphene nanoribbon may be selectively deposited on a layer of catalytic material. As a non-limiting example, the CVD process may be performed under the following conditions:

the reaction gases include methane ($CH_4$), hydrogen, and carrier gas;
the reaction temperature is between about 600° C. to about 1500° C.; and
the reaction time is 5-300 min.

The carrier gas flow rate can be at 0-10000 sccm, a ratio of the flow rate of methane and the flow rate of the carrier gas is 0.05%-50%, and a ratio of the flow rate of hydrogen and the flow rate of the carrier gas is 0.05%-50%.

Figure 2E:
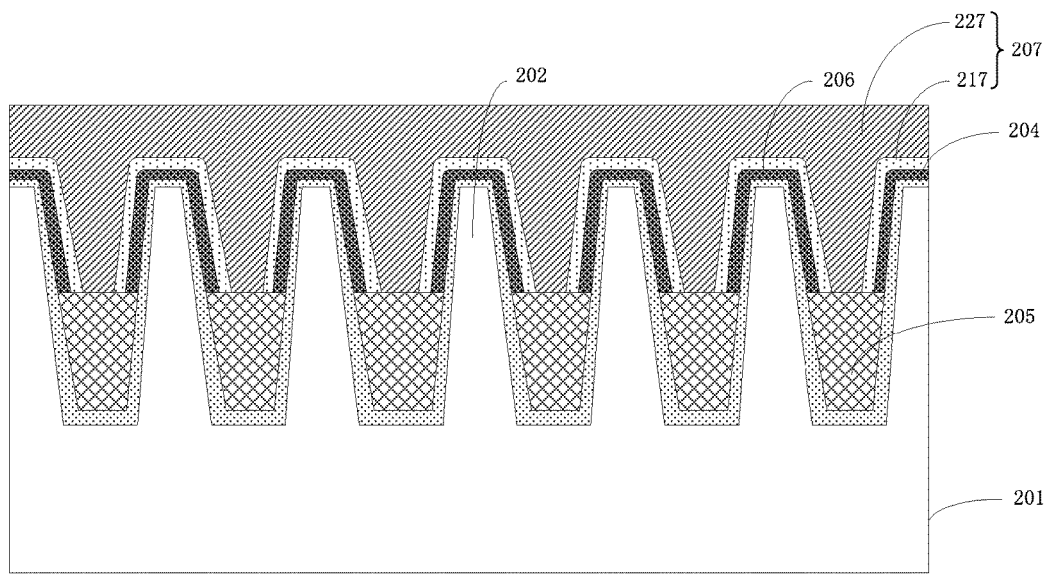
FIG. 2E is a cross-sectional diagram illustrating another stage of manufacturing a semiconductor device according to an embodiment of the present invention.

Thereafter, as shown in FIG. 2E, a gate structure 207 is formed on graphene nanoribbon 206. In one embodiment, a gate dielectric layer 217 may be formed on graphene nanoribbon 206. The material of gate dielectric layer 217 may include, but is not limited to, for example, boron nitride, aluminum nitride, silicon oxide or amorphous silicon carbide. Then, gate electrode 227 may be formed on the gate dielectric layer 217. The gate electrode material 227 may include a metal (e.g., Al, W, etc.) or polysilicon.

In one embodiment, there may be multiple semiconductor fins 202. In one case, the semiconductor substrate 201 and a plurality of fins 202 can be used as a back gate; by applying a bias voltage on the back gate, the conducting state of graphene nanoribbons 206 can be controlled. In another case, the substrate 201 under adjacent semiconductor fins can be isolated. For example, a shallow trench isolation (STI) region can be formed between the adjacent regions in semiconductor substrate 201 under the fins 202. In another example, by way of ion implantation, PN junctions can be formed in the substrate adjacent to semiconductor fins 202. In this case, the substrate and each of the semiconductor fins 202 can be used as a back gate to control the conductive state of the graphene nanoribbon.

The method according to FIG. 2A-2E may be used to form a semiconductor device as shown in FIG. 2E. According to some embodiments of the invention, the semiconductor device includes a substrate 201, a semiconductor fin 202 on the substrate, and a catalytic material layer 204 covering the semiconductor fin. The device also has an isolation region 205 on a side surface of the semiconductor fin, with the isolation region covering the catalytic material layer in a lower portion of the semiconductor fin. Further, the device has a graphene nanoribbon 206 disposed on the catalytic material layer 204 in the upper portion of the semiconductor fin; and a gate structure 207 on the graphene nanoribbon.

In an embodiment of the above device, the substrate and the semiconductor fin are configured as a back gate.

In another embodiment, the semiconductor device includes a plurality of semiconductor fins 202. An isolation region 205 is disposed between adjacent semiconductor fins, and each of the semiconductor fins is configured as a back gate. The isolation region may be STI regions or PN junctions.

In another embodiment, the catalytic material can include a layer of aluminum oxide, hafnium oxide, or zirconium oxide.

In another embodiment, the gate structure 207 includes a gate dielectric layer 217 on the graphene nanoribbon 206 and a gate 227 on the gate dielectric layer.

In another embodiment, the gate dielectric layer 217 includes one or more of boron nitride, aluminum nitride, silicon oxide, or amorphous silicon carbide, and the gate comprises a metal or polysilicon.

In another embodiment, the substrate 201 includes a silicon substrate, and the semiconductor fin is formed with silicon.

Figure 2F:
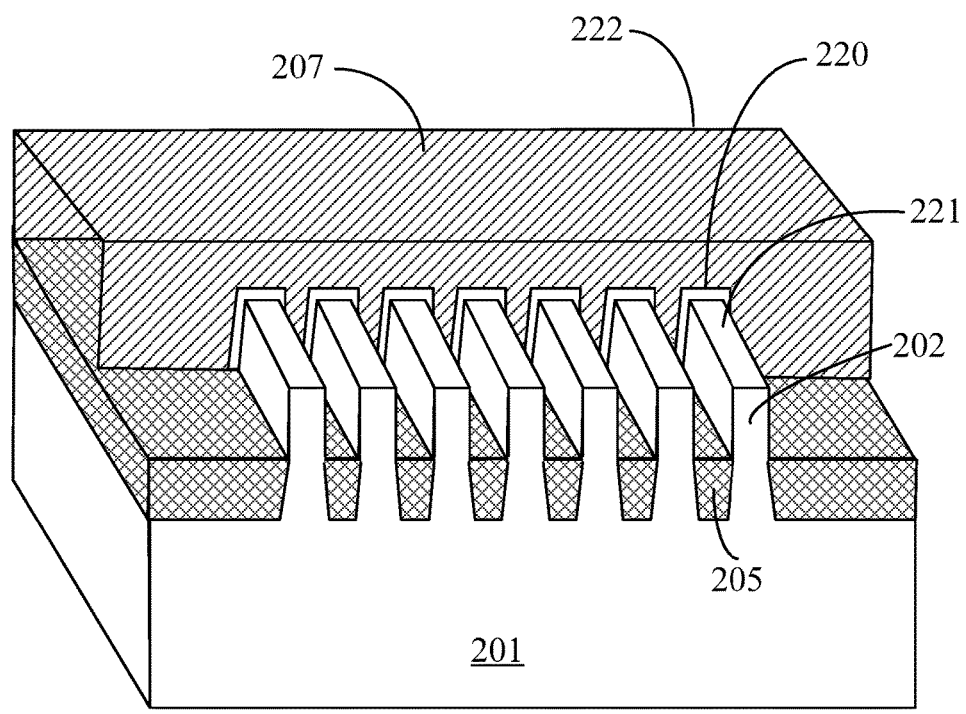
FIG. 2F is a perspective view diagram illustrating a semiconductor device according to an embodiment of the present invention.

FIG. 2F is a perspective view diagram illustrating a semiconductor device according to an embodiment of the present invention. The semiconductor device in FIG. 3 is a FinFET includes a substrate 201, a semiconductor fin 202 on the substrate, and a catalytic material layer 204 covering the semiconductor fin. The device also has an isolation region 205 on a side surface of the semiconductor fin. Further, layer 220 represent a graphene nanoribbon disposed on the catalytic material layer in the upper portion of the semiconductor fin. The semiconductor device also has a gate structure 207 on the graphene nanoribbon. A gate dielectric layer is omitted from FIG. 2F to simplify the drawing. Part of the semiconductor fin 202 is exposed for illustration purposes. In addition, a source region 221 and a drain region 222 can be formed on either side of the gate structure 207.

Heretofore, a semiconductor device according to an embodiment of the present disclosure and a method of manufacturing have been described in detail. In order to avoid obscuring the concepts of the present disclosure, some of the details known in the art are not described, and one skilled in the art will, in light of the above description, fully understand how to implement the technical solution disclosed herein. In addition, the embodiments taught in the present disclosure may be freely combined. It should be understood by those skilled in the art that various modifications may be made to the embodiments described above without departing from the spirit and scope of the present disclosure as defined by the appended claims.

What is claimed is:
1. A method for forming a semiconductor device, characterized by comprising:
providing a substrate structure, the substrate structure having:
a semiconductor substrate; and
a semiconductor fin on the substrate;
forming a catalytic material layer directly contacting and overlying an upper surface and sidewalls of the semiconductor fin;
forming an isolation region covering the catalytic material layer in a lower portion of the semiconductor fin;
forming a graphene nanoribbon on the catalytic material layer on an upper portion of the semiconductor fin covering the upper surface of the semiconductor fin; and
forming a gate structure covering the graphene nanoribbon,
wherein said catalytic material comprises a layer of aluminum oxide, hafnium oxide, or zirconium oxide, and wherein forming the gate structure covering the graphene nanoribbon comprises:
   forming a gate dielectric layer covering the graphene nanoribbon; and
   forming a gate electrode covering the gate dielectric layer.

2. The method according to claim 1, wherein the semiconductor substrate and the semiconductor fin are configured as a back gate of the semiconductor device.

3. The method according to claim 1, wherein the substrate structure comprises a plurality of semiconductor fins.

4. The method according to claim 3, wherein each of the semiconductor fins is configured as a back gate.

5. The method according to claim 1, wherein forming the isolation region comprises:
   depositing an insulating material to cover the semiconductor fin;
   planarizing the insulating material to expose a layer of the catalytic material on the upper surface of the semiconductor fin; and
   etching an upper portion of the insulating material to expose the catalytic material layer on the upper portion of the semiconductor fin.

6. The method according to claim 1, wherein forming the graphene nanoribbon comprises using a chemical vapor deposition by (CVD) process under the following conditions:
   reaction gases include methane, hydrogen and carrier gas;
   a reaction temperature is between about 600° C. to about 1500° C.;
   a reaction time is 5-300 min;
   wherein:
      a carrier gas flow rate is at 0-10000 sccm;
      a ratio of a flow rate of methane and a flow rate of the carrier gas is 0.05%-50%; and
      a ratio of a flow rate of hydrogen and the flow rate of the carrier gas is 0.05%-50%.

7. The method according to claim 1, wherein providing the substrate structure comprises:
   providing an initial substrate;
   forming a patterned hard mask on the initial substrate;
   etching the initial substrate with the patterned hard mask as an etch mask to form the substrate, and the semiconductor fin on the substrate.

8. The method according to claim 1, wherein the gate dielectric layer comprises one or more of boron nitride, aluminum nitride, silicon oxide or amorphous silicon carbide, and wherein the gate comprises a metal or polysilicon.

9. The method according to claim 1, wherein the semiconductor substrate comprises silicon, and the semiconductor fin comprises silicon.

10. A semiconductor device, comprising:
   a substrate;
   a semiconductor fin on the substrate;
   a catalytic material layer directly contacting and covering an upper surface and sidewalls of the semiconductor fin;
   an isolation region on a side surface of the semiconductor fin, the isolation region covering the catalytic material layer in a lower portion of the semiconductor fin;
   a graphene nanoribbon on the catalytic material layer on an upper portion of the semiconductor fin covering the upper surface of the semiconductor fin; and
   a gate structure covering the graphene nanoribbon,
   wherein the catalytic material comprises a layer of aluminum oxide, hafnium oxide, or zirconium oxide, and
   wherein the gate structure comprises:
      a gate dielectric layer covering the graphene nanoribbon; and
      a gate electrode covering the gate dielectric layer.

11. The semiconductor device according to claim 10, wherein the substrate and the semiconductor fin are configured as a back gate.

12. The semiconductor device according to claim 10, wherein the semiconductor device comprises a plurality of semiconductor fins.

13. The semiconductor device according to claim 12, wherein an isolation region is disposed between adjacent semiconductor fins;
   wherein each of the semiconductor fins is configured as a back gate.

14. The semiconductor device according to claim 10, wherein the gate dielectric layer comprises one or more of boron nitride, aluminum nitride, silicon oxide, or amorphous silicon carbide, and the gate comprises a metal or polysilicon.

15. The semiconductor device according to claim 10, wherein the substrate comprises silicon, and the semiconductor fin comprises silicon.

* * * * *